United States Patent
Harasawa et al.

[11] Patent Number: 5,835,418
[45] Date of Patent: Nov. 10, 1998

[54] INPUT/OUTPUT BUFFER MEMORY CIRCUIT CAPABLE OF MINIMIZING DATA TRANSFER REQUIRED IN INPUT AND OUTPUT BUFFERING OPERATIONS

[75] Inventors: Akio Harasawa; Teruo Kaganoi, both of Tokyo, Japan

[73] Assignee: NEC Corporation, Tokyo, Japan

[21] Appl. No.: 938,839

[22] Filed: Sep. 26, 1997

[30] Foreign Application Priority Data

Sep. 27, 1996 [JP] Japan .................................. 8-256807

[51] Int. Cl.$^6$ .................................................. G11C 16/04
[52] U.S. Cl. ............................. 365/189.05; 365/189.03
[58] Field of Search ........................ 365/189.05, 189.03, 365/189.04

[56] References Cited

U.S. PATENT DOCUMENTS

| | | | |
|---|---|---|---|
| 5,065,365 | 11/1991 | Hirayama | 365/189.05 |
| 5,490,113 | 2/1996 | Tatosian et al. | 365/189.05 |
| 5,602,781 | 2/1997 | Isobe | 365/189.05 |

FOREIGN PATENT DOCUMENTS

| | | |
|---|---|---|
| 0 262 468 A2 | 4/1988 | European Pat. Off. . |
| 0 262 468 A3 | 4/1988 | European Pat. Off. . |
| 2-73591 | 3/1990 | Japan . |
| 4-274516 | 9/1992 | Japan . |

OTHER PUBLICATIONS

Wescon 1993 Conference Recorded Proceedings, 9–93, IEEE, NY USA, pp. 571–579, Smith: "The SARAM, A New Kind of Dual–Port Memory for Communications Now and Beyond"Xp0022063469.
French Search Report dated Apr. 27, 1998.

*Primary Examiner*—David Nelms
*Assistant Examiner*—David Lam
*Attorney, Agent, or Firm*—Whitham, Curtis & Whitham

[57] ABSTRACT

In order to buffer a succession of input data sets to produce a succession of output data sets, an input/output buffer memory circuit includes a plurality of internal memory elements (1), each having a memory capacity capable of memorizing each of the input data sets. An input port (2) and an input control circuit (3) write each of the input data sets in any one of the internal memory elements as an internal data set. At least one random access port (4) carries out a random access to any one of the internal memory elements to subject the internal data set of any one of the internal memory elements to an internal data processing as a processed data set. An output control circuit (6) reads the processed data set out of any one of the internal memory elements and delivers the read data set to an output port (5) as each of the output data sets. A switching control circuit (7) controls the internal memory elements to successively connect each of the internal memory elements to the input control circuit, the random access port, and the output control circuit. Preferably, the switching control circuit periodically switches, at a predetermined time interval, the internal memory elements so as to simultaneously carry out an output control for one of the internal memory elements, the random access to another one of the internal memory elements, and an input control for still another one of the internal memory elements a time in the predetermined time interval.

8 Claims, 10 Drawing Sheets

INPUT/OUTPUT BUFFER MEMORY CIRCUIT CAPABLE OF MINIMIZING DATA TRANSFER REQUIRED IN INPUT AND OUTPUT BUFFERING OPERATIONS

BACKGROUND OF THE INVENTION

This invention relates to a data processing system for processing an object data set, such as an ATM cell, comprising a predetermined number of data and, in particular, to an input/output buffer memory circuit which is arranged in an input/output section of the processing system or which serves as an interface for delivering and receiving the object data set to and from a processing pipeline in the processing system.

For example, a conventional input/output buffer memory circuit of the type is used in an LSI (Large Scale Integrated circuit) for processing an ATM (Asynchronous Transfer Mode) cell and arranged in an input or an output section of the LSI to serve as a buffering mechanism for absorbing or buffering the difference between a data input or output rate outside of the LSI and a data processing rate within the LSI.

In case where a processing system comprises a plurality of internal data processing stages within the LSI, an object data set supplied to an input buffer memory is delivered through the internal data processing stages to reach an output buffer memory after repetition of data transfer and internal data processing at each stage. Alternatively, in another processing system including an internal data processing circuit of a microprocessor type, it is desired that a buffer memory circuit allows both sequential access for input/output on a FIFO (First-In First-Out) basis and random access for internal data processing.

FIG. 1 shows a typical conventional input buffer memory circuit. The input buffer memory circuit comprises an input port (FIFO input port) 2 and an input buffer memory. The input buffer memory comprises an input control circuit (FIFO input control circuit) 3 and a memory element 31 having first and second memory ports IWDATA and ORDATA. In the input buffer memory circuit, input data as object data are sequentially supplied through the input port 2. Under control of the input control circuit 3, the input data are written through the first memory port IWDATA into the memory element 31 as written data. The written data are read from the memory element 31 through the second memory port ORDATA. When the written data are read through the second memory port ORDATA, random access or sequential access such as a FIFO-based output is selected in dependence upon interface easiness with an internal processing system (not shown). In case of the sequential access, an additional control circuit (not shown) is required.

FIG. 2 shows a typical conventional output buffer memory circuit. The output buffer memory circuit comprises an output port (FIFO output port) 5 and an output buffer memory. The output buffer memory comprises a memory element 31 having first and second memory ports IWDATA and ORDATA, and an output control circuit (FIFO output control circuit) 6. After completion of all processing in an internal processing system, processed data are written as written data in the memory element 31 through the first memory port IWDATA in either a random write mode or a sequential write mode. Under control of the output control circuit 6, the written data are read through the second memory port ORDATA to be sequentially delivered from the output port 5.

FIG. 3 shows a typical processing system including a plurality of internal processing stages. The processing system comprises an input buffer memory 32, an output buffer memory 33, and first through N-th (N being a positive integer greater than one) internal processing stages $34_1$ through $34_N$ between the input and output buffer memories 32 and 33. Object data are essentially transferred from the input buffer memory 32 to the first internal processing stage $34_1$ to be subjected to first processing into first processed data. The first processed data are transferred from the first internal processing stage $34_1$ to the second internal processing stage $34_2$ to be subjected to second processing into second-processed data. Likewise, the (N−1)-th processed data are supplied to the N-th internal processing stage $34_N$ to be subjected to N-th processing into output processed data which are transferred to the output buffer memory 33. Each of the second through the N-th internal processing stages $34_1$ through $34_N$ has a buffer memory 35 arranged at an input section to absorb the difference in processing phase between the preceding internal processing stage and the internal processing stage in consideration.

Japanese Unexamined Patent Publication (JP-A) No. 274516/1992 discloses a system arrangement for storing digital data on a FIFO basis which can achieve considerable reduction in size of a circuit structure (FIG. 2 in the publication). The system arrangement comprises a plurality of random access memories each of which has a single access gate (single port), and a control unit for controlling access to the random access memories so that writing and reading operations to and from the random access memories are carried out simultaneously or in an asynchronous fashion.

Japanese Unexamined Patent Publication (JP-A) No. 73591/1990 (corresponding to U.S. Pat. No. 5,255,238) discloses a FIFO memory which not only has an ordinary FIFO function of serial input/output but also achieves a random access function. The FIFO memory comprises a memory cell array and a mechanism for arbitrating sequential access and random access to the memory cell array. The mechanism enables the sequential access and the random access to the memory cell array.

The above-mentioned prior arts has disadvantages as follows.

A disadvantage in an input/output buffer memory circuit using a combination of the above-mentioned prior arts illustrated in FIGS. 1 and 2 is an increase in power consumption. In the input/output buffer memory circuit using the above-mentioned prior arts illustrated in FIGS. 1 and 2, each of the input and the output buffer memories simply acts as a FIFO memory. Therefore, at an output end of the input buffer memory or an input end of the output buffer memory, all of the object data must be transferred. Likewise, between the internal processing stages, all of the object data are essentially transferred. This results in frequent occurrence of switching of internal elements at circuit portions through which the object data are transferred.

Another disadvantage in the input/output buffer memory circuit using the above-mentioned prior arts illustrated in FIGS. 1 and 2 resides in an increase in circuit scale of a data transfer controlling section. As described in conjunction with the first disadvantage, the data transfer is performed everywhere in the circuit according to the prior art. As a consequence, the circuit scale of the data transfer controlling and executing section is increased. This adversely affects an overall circuit scale.

Still another disadvantage in the above-mentioned prior art illustrated in FIG. 3 is an increase in a buffer memory scale due to the buffer memories 35 for absorption of the difference in processing phase between the processing stages. For example, consideration will be made about the operation of transferring the object data from the preceding internal processing stage to the succeeding internal processing stage. It is assumed here that processing in the preceding internal processing stage has completed and the data transfer is executed before the succeeding internal processing stage is ready to receive next object data. In this case, the buffer memory 35 is required to absorb the difference in processing phase between the preceding and the succeeding internal processing stages. In case where such buffer memory 35 is arranged at each portion where the data transfer is executed, the circuit scale is inevitably increased.

A further disadvantage in the above-mentioned prior art of FIG. 3 resides in an increase in processing delay in the processing system. Specifically, the data are transferred between the processing stages every time when the processing in the preceding processing stage has been completed. In addition, as pointed out as the disadvantage, the data are made to pass through the buffer memory 35 at each junction between the processing stages. With this structure, the overall delay between the input and the output of the data is inevitably increased.

A still further disadvantage in the above-mentioned prior art resides in insufficient processing performance. According to the above-mentioned Japanese Unexamined Patent Publication (JP-A) No. 274516/1992, sequential writing and sequential reading operations to and from the buffer memory can be simultaneously executed but random access is impossible. Thus, the buffer memory simply serves as a FIFO memory. After the data are extracted by data transfer from the FIFO memory, data processing is enabled. As disclosed in Japanese Unexamined Patent Publication (JP-A) No. 73591/1990, it is possible to carry out reference to and rewriting of the data by sequential writing and sequential reading operations as well as random access. However, a memory space for storage is only one so that the mechanism for arbitrating a plurality of access requests and thus a plurality of access operations is impossible. In both cases disclosed in the above-mentioned two publications, it is impossible to simultaneously execute input/output and reference/modification of the object data. Therefore, processing ability of the processing system can not be improved.

SUMMARY OF THE INVENTION

It is an object of this invention to provide an input/output buffer memory circuit capable of minimizing the frequency of data transfer required in a data path from data input and data output so as to suppress power consumption, to reduce a circuit scale of a data transfer control section, to remove a buffer memory scale related to internal data transfer, and to decrease processing delay in an overall processing system.

It is another object of this invention to provide an input/output buffer memory circuit capable of simultaneously executing data processing operations including input, internal data processing, and output of object data such as ATM cells so as to improve performance.

An input/output buffer memory circuit to which this invention is applicable is for buffering a succession of input data sets to produce a succession of output data sets.

According to this invention, the input/output buffer memory circuit comprises; an input port for receiving each of the input data sets; a plurality of internal memory elements, each having a memory capacity capable of memorizing each of the input data sets; an input control circuit connected to the input port for writing each of the input data sets in any one of the internal memory elements as an internal data set; at least one random access port for carrying out a random access to any one of the internal memory elements to subject the internal data set of any one of the internal memory elements to an internal data processing as a processed data set; an output port; an output control circuit connected to the output port for reading the processed data set out of any one of the internal memory elements as a read data set to deliver the read data set to the output port as each of the output data sets; and a switching control circuit for controlling the internal memory elements to successively connect each of the internal memory elements to the input control circuit, the random access port, and the output control circuit.

Typically, each of the internal memory elements operates as an input FIFO (First-In First-Out) memory when each of the internal memory elements is connected to the input control circuit under control of the switching control circuit. Each of the internal memory elements operates as a random access memory when each of the internal memory elements is connected to the random access port under control of the switching control circuit. Each of the internal memory elements operates as an output FIFO (First-In First-Out) memory when each of the internal memory elements is connected to the output control circuit under control of the switching control circuit.

Preferably, the switching control circuit periodically switches, at a predetermined time interval, the internal memory elements connected to the input control circuit, the random access port, and the output control circuit, respectively, so as to simultaneously carry out an output operation of the output data set from one of the internal memory elements to the output port by the output control circuit, a random access operation to another one of the internal memory elements by the random access port, and an input operation of the input data set from the input port to still another one of the internal memory elements by the input control circuit at a time in the predetermined time interval.

Alternatively, the switching control circuit switches, at a status-dependent time interval, the internal memory elements connected to the input control circuit, the random access port, and the output control circuit, respectively, so as to simultaneously carry out an output operation of the output data set from one of the internal memory elements to the output port by the output control circuit, a random access operation to another one of the internal memory elements by the random access port, and an input operation of the input data set from the input port to still another one of the internal memory elements by the input control circuit at a time in the status-dependent time interval. The status-dependent time interval is determined in dependence upon a status of current connection of each of the internal memory elements to the input control circuit, the random access port, and the output control circuit and upon another status of availability of the input control circuit, the random access port, and the output control circuit to which each of the internal memory elements is subsequently connected.

The above-mentioned at least one random access port may be a plurality of random access ports. In this case, the switching control circuit successively connects each of the internal memory elements to the plurality of random access ports so that the plurality of random access ports carry out a plurality of random access to each of the internal memory elements to subject the internal data set of each of the internal memory elements to a plurality of internal data processing as the processed data set in a pipeline fashion.

An output random access port may be substituted for a combination of the output control circuit and the output port to read the processed data set out of any one of the internal memory elements as the read data set and to deliver the read data set as each of the output data sets.

An input random access port may be substituted for a combination of the input port and the input control circuit to receive each of the input data sets and to write each of the input data sets in any one of the internal memory elements as the internal data set.

In the input/output buffer memory circuit according to this invention, the data set supplied thereto and written in a particular one of the internal memory elements is not transferred until it is extracted from the output port, but is processed by access from the random access port which can be connected to any one of the internal memory elements with the connection successively switched from one to another.

Each of the internal memory elements is controlled by the switching control circuit to be connected to a selected one of the input control circuit, the random access port, and the output control circuit. The internal memory element serves as an input FIFO memory, a random access memory space for internal data processing, and an output FIFO memory when it is connected to the input control circuit, the random access port, and the output control circuit, respectively.

The internal memory elements is independent internal memory elements which have independent memory ports, respectively. This means that a FIFO-based input operation, at least one random access operation, and a FIFO-based output operation can simultaneously be executed for different internal memory elements or different data sets. In other words, with respect to a single data set, FIFO-based input processing, internal data processing by random access, and FIFO-based output processing are executed in a pipeline fashion.

The switching control circuit may carry out switching control in a time-monitoring method or a state-monitoring method. In the time-monitoring method, a particular access port is switched to a next access port after lapse of a predetermined time duration. In the state-monitoring method, switching is controlled with reference to the state of access from a current access port currently connected to the internal memory element and the state of availability of the next access port to be connected next.

In the input/output buffer memory circuit according to this invention, a whole of the object data set is not transferred except in case of the FIFO-based input and the FIFO-based output operations. Therefore, it is possible to avoid the increase both in power consumption accompanying the data transfer and in circuit scale of a data transfer control section. In addition, no special buffer memory is required between the processing stages to absorb difference in processing phase. Instead, a buffer memory for absorbing difference in processing phase is shared by the overall processing system. Therefore, it is possible to remove a buffer memory scale between the processing stages and to reduce the processing delay in the overall system. Sharing of the buffer memory as described above is analogous to the concept of a common buffer memory in an ATM switch. Specifically, a buffer memory resource is not fixedly provided at a specific position in the system but a required amount of the buffer memory resource is assigned to a position where the buffer memory temporarily required. Therefore, the memory resource can be efficiently used as a whole.

DESCRIPTION OF THE PREFERRED EMBODIMENTS

Figure 1:
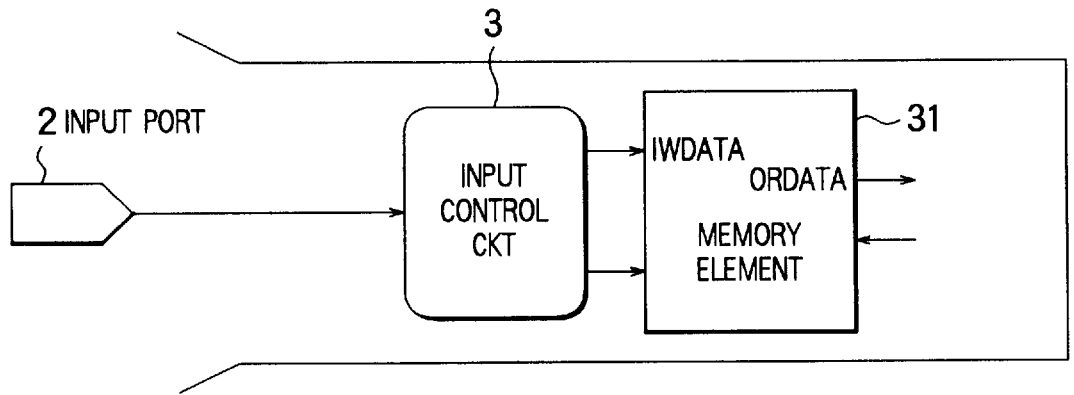
FIG. 1 is a block diagram of a conventional input buffer memory circuit.
Figure 2:
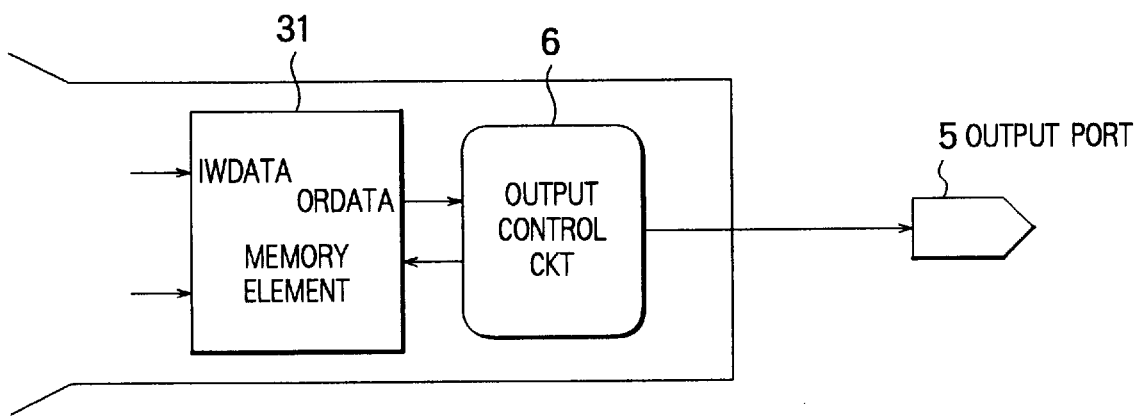
FIG. 2 is a block diagram of a conventional output buffer memory circuit.
Figure 3:
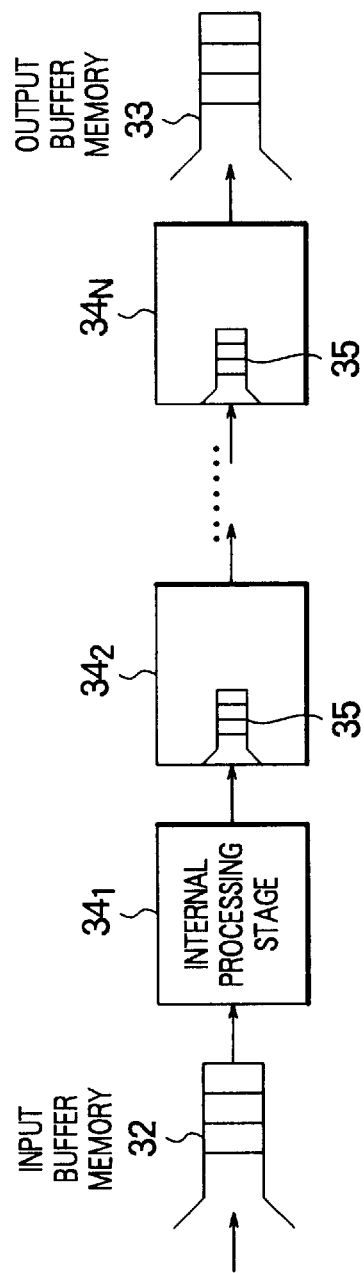
FIG. 3 is a block diagram of a conventional processing system including a plurality of internal processing stages.

Now, description will be made about several preferred embodiments of this invention with reference to the drawing.

Figure 4:
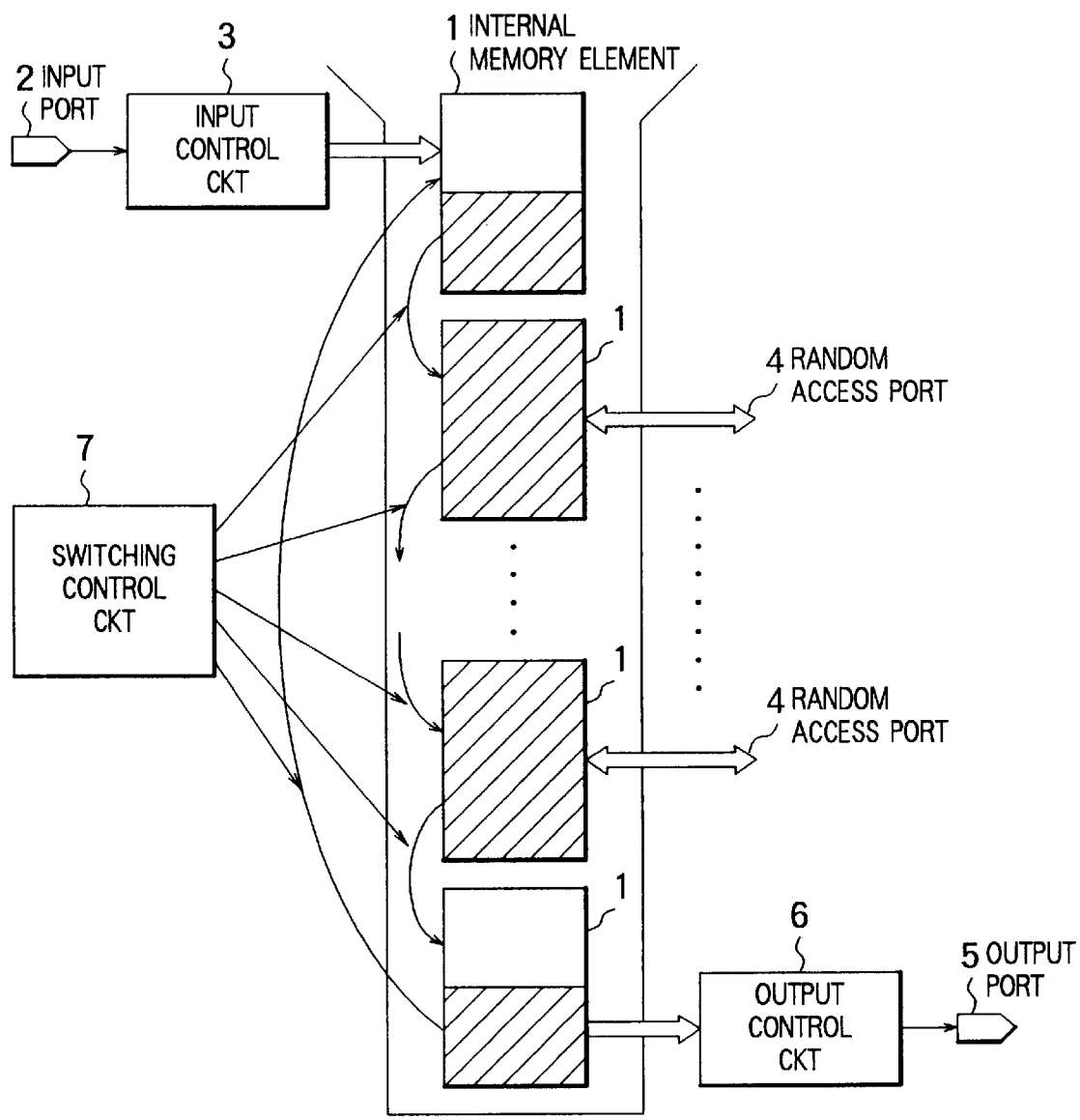
FIG. 4 is a block diagram of an input/output buffer memory circuit according to a first embodiment of this invention.

Referring to FIG. 4, an input/output buffer memory circuit according to a first embodiment of this invention is for buffering a succession of data sets which includes a predetermined number of data. The input/output buffer memory circuit includes a plurality of internal memory elements 1 each of which has a memory capacity capable of memorizing each data set, an input port 2 supplied with the data of each data set, an input control circuit 3 connected to the input port 2 and sequentially supplied with the data of each data set from the input port 2 for writing each data set into any one of the internal memory elements 1, a plurality of random access ports 4 each of which is for accessing any one of the internal memory elements 1 to carry out internal data processing, an output port 5, an output control circuit 6 connected to the output port 5 for reading each data set from any one of the internal memory elements 1 as a read data set to sequentially deliver the data of the read data set to the output port 5, and a switching control circuit 7 for controlling connection of any one of the internal memory elements 1 to the input control circuit 3, connection of any one of the internal memory elements 1 to each of the random access ports 4, and connection of any one of the internal memory elements 1 to the output control circuit 6. In this event, the switching control circuit 7 controls the internal memory elements 1 to successively connect each of the internal memory elements 1 to the input control circuit 3, the random access ports 4, and the output control circuit 6.

At a particular time instant, each of the internal memory elements 1 is connected to any one of the input control circuit 3, the random access ports 4, and the output control circuit 6. Such connection is switched under control of the switching control circuit 7.

Figure 5:
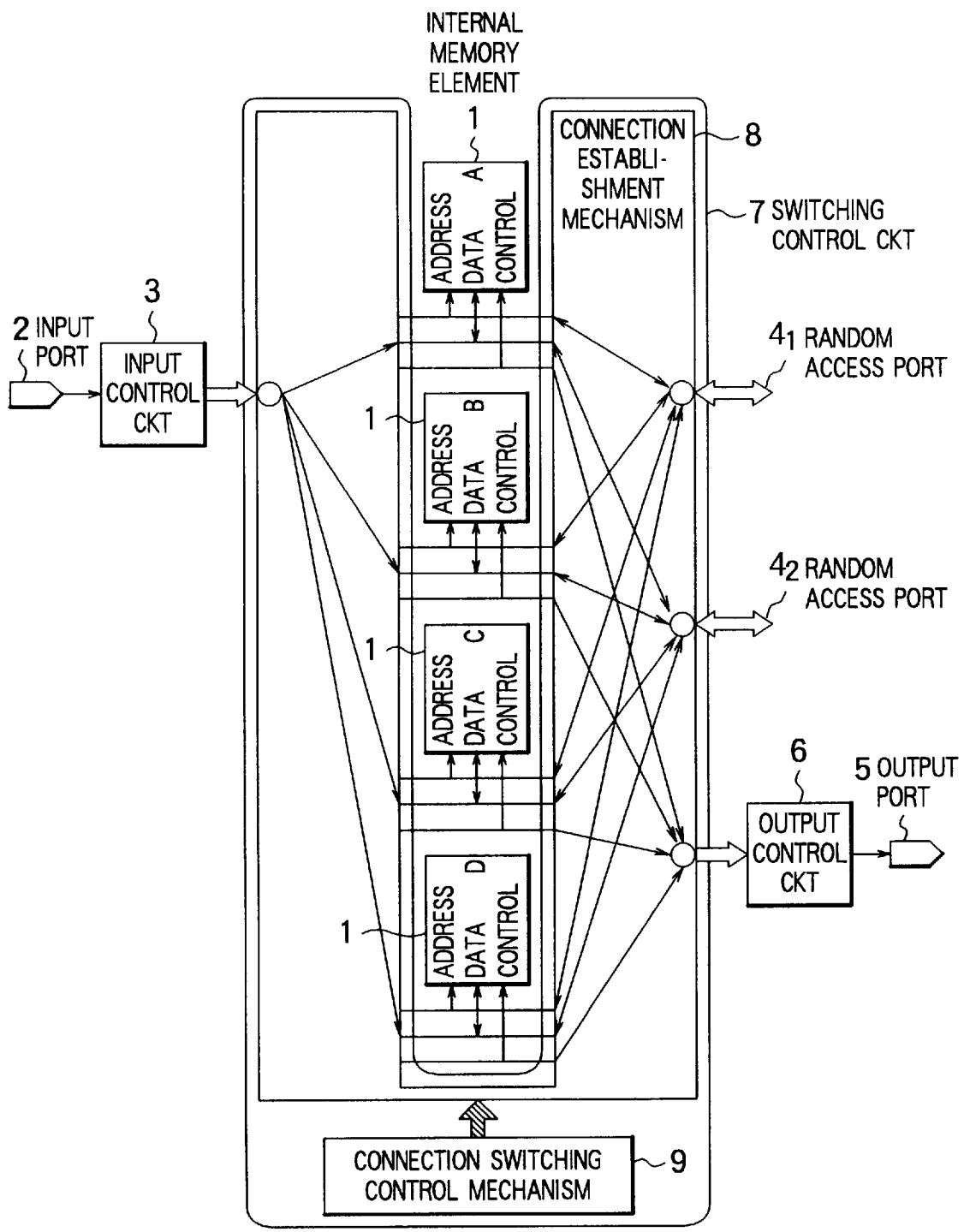
FIG. 5 is a detailed block diagram of the input/output buffer memory circuit illustrated in FIG. 4.

Referring to FIG. 5, it is assumed that the number of the random access ports 4 is equal to two while the number of the internal memory elements 1 is equal to four. In the figure, the two random access ports 4 are depicted at $4_1$ and $4_2$ as first and second random access ports, respectively, while the four internal memory elements 1 are depicted at A, B, C, and D as first through fourth internal memory elements, respectively. As illustrated in FIG. 5, the switching control circuit 7 comprises a connection establishment mechanism 8 for establishing connection of each of the input control circuit 3, the first and the second random access ports $4_1$ and $4_2$, and the output control circuit 6 to any one of the first through the fourth internal memory elements 1-A through 1-D. Switching of the connection is carried out collectively for address buses, data buses, memory access control signals, and the like. In addition to the connection establishment mechanism 8, the switching control circuit 7 comprises a connection switching control mechanism 9 for controlling the connection establishment mechanism 8 in accordance with the definition of a connection switching condition.

Figure 6:
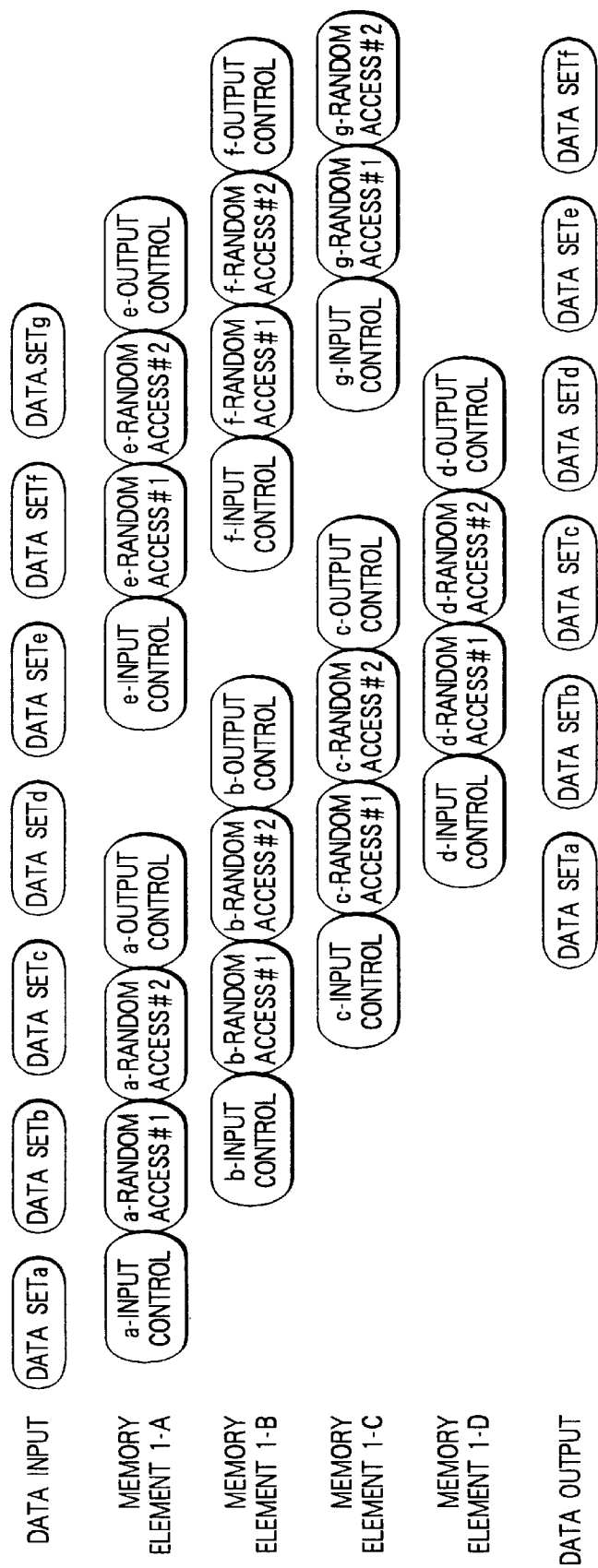
FIG. 6 is a timing chart for describing the operation of the input/output buffer memory circuit illustrated in FIG. 5.

Next referring to FIGS. 5 and 6, the operation of the input/output buffer memory circuit of this embodiment will be described.

A plurality of data sets a, b, c, d, e, f, g, . . . are supplied through the input port 2. At the start of operation, the connection establishment mechanism 8 in the switching control circuit 7 establishes connection between the input control circuit 3 and the first internal memory element 1-A. Accordingly, the data set a is written into the first internal memory element 1-A (a-INPUT CONTROL). After completion of input of the data set a, the connection establishment mechanism 8 switches the connection of the first internal memory element 1-A to the first random access port $4_1$ (RANDOM ACCESS #1). After the first internal memory element 1-A with the data set a stored therein is connected to the first random access port $4_1$ and subjected to a read access or a write access operation, the connection establishment mechanism 8 switches the connection of the first internal memory element 1-A to the second random access port $4_2$ (RANDOM ACCESS #2). After the first internal memory element 1-A is connected to the second random access port $4_2$ and subjected to a read access or a write access operation, the internal memory element 1-A is connected to the output control circuit 6 (a-OUTPUT CONTROL). The data set a is sequentially read as output data.

In the similar manner, the data sets b, c, d, e, f, g, . . . following the data set a are written into the internal memory elements 1-B, 1-C, 1-D, 1-A, 1-B, 1-C, . . . , respectively, under control of the input control circuit 3. Thereafter, each of the data sets b, c, d, e, f, g, . . . is processed with the connection successively switched to the first random access port $4_1$, the second random access port $4_2$, and the output control circuit 6 and is eventually produced as output data. The first through the fourth internal memory elements 1-A through 1-D have independent ports, respectively, and are independently accessed. Thus, this system is operated in a pipeline fashion. At each stage, different data sets can be processed simultaneously.

The connection establishment mechanism 8 is controlled by the connection switching control mechanism 9 in accordance with the definition of the connection switching condition. For example, the definition may be such that, after lapse of a predetermined time duration following establishment of connection to one of the input control circuit 3, the output control circuit 6, or the random access ports 4 (may collectively be called an access port), the connection is switched to a next access port. Alternatively, the definition may be such that the connection is released in response to notification of completion of access from a current access port currently connected and that new connection is immediately established if the next access port to be connected is ready for connection and, if not, a connection standby state is continued until the next access port becomes ready for connection. In individual applications, these definitions are selectively adopted in dependence upon the nature of the object data to be dealt with or the nature of operation of the access port to be connected. For simplicity, the former and the latter definitions will hereafter be called a time-based definition and a status-based definition, respectively.

Next referring to FIG. 7, a first circuit arrangement of the input/output buffer memory circuit will be described in detail. In this arrangement, the connection switching control mechanism adopts the time-based definition. Specifically, the connection is switched after lapse of a predetermined time duration as described above. However, the definition is different for the switching operation from the connection to the input control circuit 3 to the connection to the first random access port $4_1$.

Figure 7:
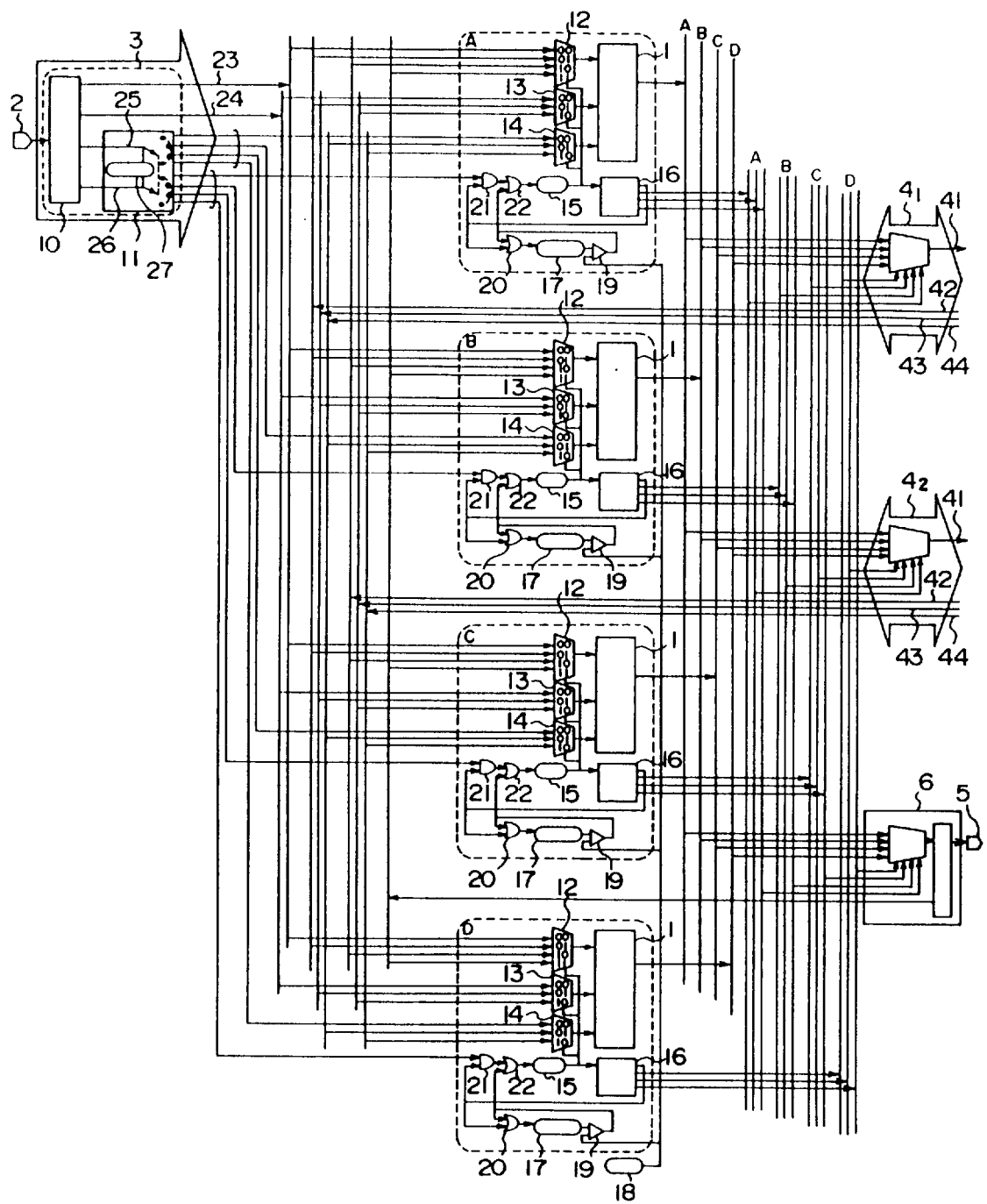
FIG. 7 shows a first example of a circuit arrangement of the input/output buffer memory circuit illustrated in FIG. 5.

As illustrated in FIG. 7, the access ports include the input control circuit 3, the first and the second random access ports $4_1$ and $4_2$, and the output control circuit 6. The input control circuit 3 comprises a write control section 10 for producing addresses 23, data 24, write pulses 25, and write completion pulses 26 in order to write into the memory elements 1 the object data sets sequentially supplied, and a write object specifying section 11 for specifying one of a plurality of writable surfaces as a write object surface.

Each of first through fourth memory blocks depicted at A, B, C, and D comprises the memory element 1, an address input multiplexer 12 for an address input signal supplied from each access port, a data input multiplexer 13 for a data input signal supplied from each access port having a write function into the memory element 1, a write control input multiplexer 14 for a write control input signal supplied from each access port having a write function into the memory element 1, a position register 15 for holding information indicative of a destination access port to be currently connected to the memory block in consideration, a position decoder 16 for decoding the value of the position register 15 to produce a signal notifying connection of the memory block to the destination access port, a timer 17 which is automatically started in response to a system clock and reset every time when the destination access port is renewed and which is for indicating the time duration of connection to the destination access port, a comparator 19 for judging whether or not the time duration measured by the timer 17 reaches a preselected connection switching time period 18 defined for each individual memory block or in common to the memory blocks, an OR gate 20 for obtaining a timer resetting condition upon occurrence of switching of connection or upon completion of the writing operation of the input data set, and OR gates 21 and 22 for obtaining a position register value renewing condition upon completion of the writing operation of the data set from the input control circuit 3 into the memory block or upon occurrence of switching of connection.

Now, the operation of the circuit arrangement in FIG. 7 will be described. At the start of operation, the position register 15 in each of all the memory blocks indicates the connection (00) to the input control circuit 3. All surfaces are kept in a stand-by state in which address input, data input, write pulse input from the input control circuit 3 are selected. However, a pointer register 27 in the write object specifying section 11 of the input control circuit 3 indicates the memory block A (00). Therefore, the memory access control signals (the write pulses and the write completion pulses) for the write access operation corresponding to the data set a as first input data are supplied only to the memory block A. The remaining memory blocks except the memory block A is supplied with no data to be written. In the memory block A with the data set a written therein and the write completion pulse supplied thereto, the position register 15 is renewed to a value (01) indicative of connection to the first random access port $4_1$. Simultaneously, the pointer register 27 of the write object specifying section 11 in the input control circuit 3 is renewed to a value (01) indicative of the memory block B. In the memory block A, the value of the position register 15 serves to select those signals produced by the processing system connected to the first random access port $4_1$ with respect to the address input signal, the data input signal, and the write pulse. An output signal of the position decoder 16 in the memory block A notifies the processing system connected to the first random access port $4_1$ of the fact that the memory block A is currently connected to the first random access port $4_1$. In case where the first random access port $4_1$ accesses the memory block A for the write access operation without specifying the memory block to be accessed, the destination is automatically set to the memory block A. In case of the read access operation, address indication is carried out in such a manner that the data on the bus A is selected as the data to be read without distinguishing the destination memory block to be accessed. During the above-mentioned process, the timer 17 in the memory block A is started from a reset value of zero and continuously monitors the time duration of staying at the first random access port $4_1$. When the comparator 19 detects that the time duration of connection of the memory block A to the first random access port $4_1$ reaches the preselected time period, the timer 17 is again reset into zero while the position register 15 is renewed to a value (10) indicative of connection to the second random access port $4_2$. The operation of the system during connection to the second random access port $4_2$ is similar to that during connection to the first random access port $4_1$ and will not be described any longer.

After completion of connection to the second random access port $4_2$ and switching of connection to the output control circuit 6, the operation is similar to that during connection to the first or the second random access port $4_1$ or $4_2$. However, no write access operation is carried out during connection to the output control circuit 6. When the time duration of connection to the output control circuit 6 reaches the preselected timer period, the position register 15 in the memory block is renewed to the value (00) indicative of connection to the input control circuit 3. The memory block is then ready for input of the data set e.

Next referring to FIG. 8, a second circuit arrangement of the input/output buffer memory circuit will be described. In this circuit arrangement, the status-based definition is adopted for switching of connection in the connection switching control mechanism 9. Specifically, connection is switched in dependence upon the status of completion of access from the current access port currently connected and the status of availability of the next access port to be connected next.

Figure 8:
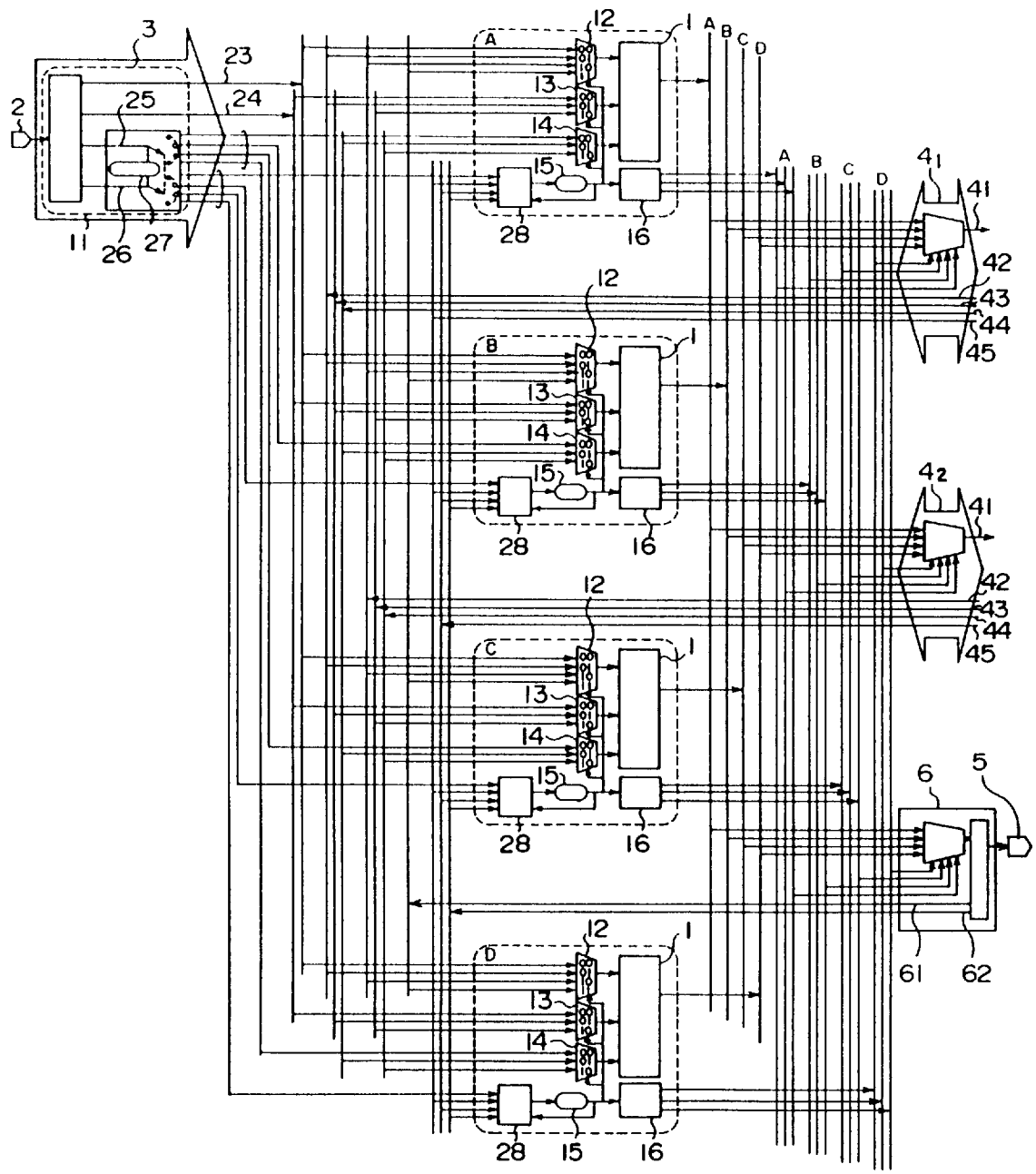
FIG. 8 shows a second example of the circuit arrangement of the input/output buffer memory circuit illustrated in FIG. 5.

As illustrated in FIG. 8, the access ports include the input control circuit 3, the first and the second random access ports $4_1$ and $4_2$, and the output control circuit 6. The input control circuit 3 comprises a write control section 10 for producing addresses 23, data 24, write pulses 25, and write completion pulses 26 in order to write into the memory elements 1 the object data sets sequentially supplied, and a write object specifying section 11 for specifying one of a plurality of writable surfaces as a write object surface.

Each of first through fourth memory blocks depicted at A, B, C, and D comprises the memory element 1, an address input multiplexer 12 for an address input signal supplied from each access port, a data input multiplexer 13 for a data input signal supplied from each access port having a write function into the memory element 1, a write control input multiplexer 14 for a write control input signal supplied from each access port having a write function into the memory element 1, a position register 15 for holding information indicative of a destination access port to be currently connected to the memory block in consideration, a position decoder 16 for decoding the value of the position register 15 to produce a signal notifying connection of the memory block to the destination access port, and a finite state machine 28 for producing a position register renewal control signal with reference to the value of the position register in the memory block and the information indicative of the state of access from each access port to the memory block.

The operation of the circuit arrangement in FIG. 8 will be described. At the start of operation, the position register 15 in each of all the memory blocks indicates the connection (00) to the input control circuit 3. All surfaces are kept in a stand-by state in which address input, data input, write pulse input from the input control circuit 3 are selected. However, a pointer register 27 in the write object specifying section 11 of the input control circuit 3 indicates the memory block A (00). Therefore, the memory access control signals (the write pulses and the write completion pulses) for the write access operation corresponding to the data set a as first input data are supplied only to the memory block A. The remaining memory blocks except the memory block A is supplied with no data to be written. Supplied with the data set a and the write completion pulse, the position register 15 In the memory block A is renewed to a value (01) indicative of connection to the first random access port $4_1$. Simultaneously, the pointer register 27 of the write object specifying section 11 in the input control circuit 3 is renewed to a value (01) indicative of the memory block B. In the memory block A, the value of the position register 15 serves to select those signals produced by the processing system connected to the first random access port $4_1$ with respect to the address input signal, the data input signal, and the write pulse. An output signal of the position decoder 16 in the memory block A notifies the processing system connected to the first random access port $4_1$ of the fact that the memory block A is currently connected to the first random access port $4_1$. In case where the first random access port $4_1$ accesses the memory block A for the write access operation without specifying the memory block to be accessed, the destination is automatically set to the memory block A. In case of the read access operation, address indication is carried out in such a manner that the data to be read are retrieved from the bus A without distinguishing the destination memory block to be accessed. When the memory block A is connected to the first random access port $4_1$, namely, when the position register 15 in the memory block A has a value "01", the first random access port $4_1$ produces a memory block access indication representative of access completion. In addition, the second random access port $4_2$ produces another memory block access indication representative of an unaccessed state. When the finite state machine 28 in the memory block A detects these memory block access indications, the position register 15 in the memory block A is renewed to the value (10) indicative of connection to the second random access port $4_2$. The system operation during connection to the second random access port $4_2$ is similar to that during connection to the first random access port $4_1$ and will not be described any longer.

After completion of connection to the second random access port $4_2$ and switching of connection to the output control circuit 6, the finite state machine 28 in the memory block A detects access completion as the memory block access indication produced by the output control circuit 6, the position register 15 in the memory block A is renewed to the value (00) indicative of connection to the input control circuit 3. The memory block is then ready to receive the input of the data set e.

Next referring to FIG. 9, description will be made as regards an input/output buffer memory circuit according to a second embodiment of this invention.

Figure 9:
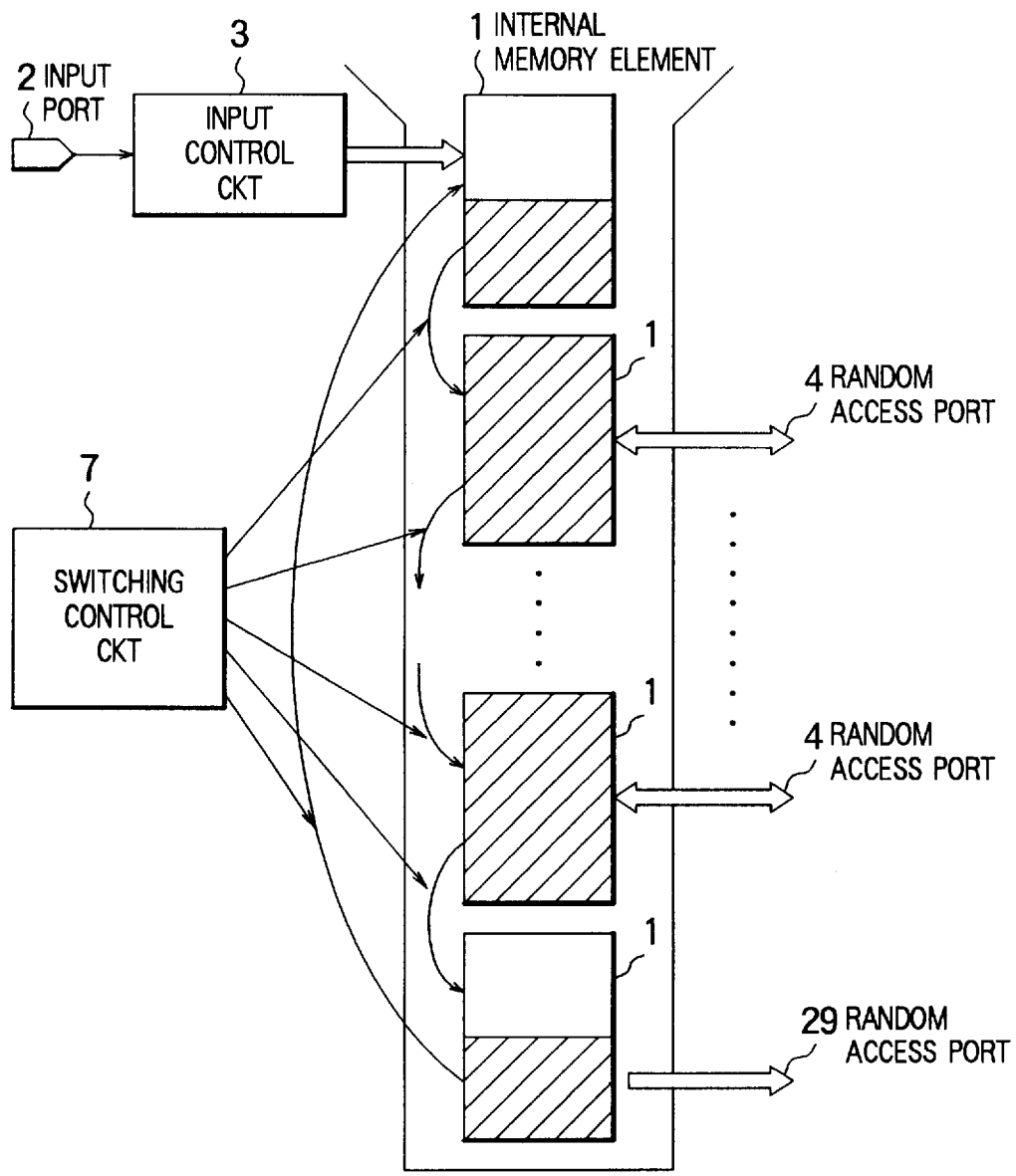
FIG. 9 is a block diagram of an input/output buffer memory circuit according to a second embodiment of this invention.

As illustrated in FIG. 9, the output control circuit 6 and the output port 5 in the first embodiment are replaced by an output random access port 29. This embodiment is effective in case where the input/output buffer memory circuit is used in a system such that the random access is preferred as the mode of extracting the output data rather than the sequential access.

Next referring to FIG. 10, description will be made about an input/output buffer memory circuit according to a third embodiment of this invention.

Figure 10:
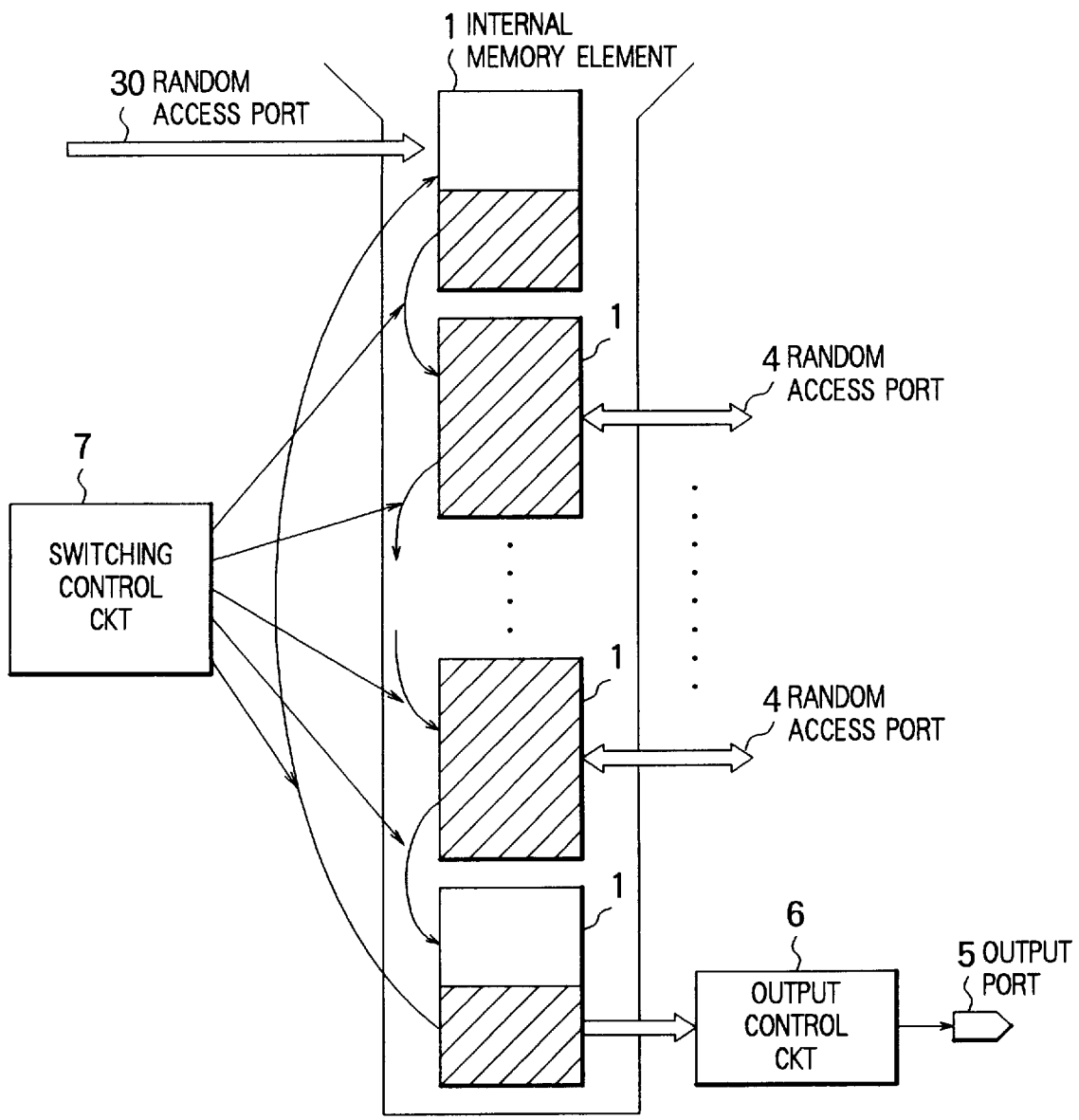
FIG. 10 is a block diagram of an input/output buffer memory circuit according to a third embodiment of this invention.

As illustrated in FIG. 10, the input control circuit 3 and the input port 2 in the first embodiment are replaced by an input random access port 30. This embodiment is effective in case where the input/output buffer memory circuit is used in a system such that the random access is preferred as the mode of input of the input data rather than the sequential access.

Next referring to FIG. 11, description will be made about an input/output buffer memory circuit according to a fourth embodiment of this invention.

Figure 11:
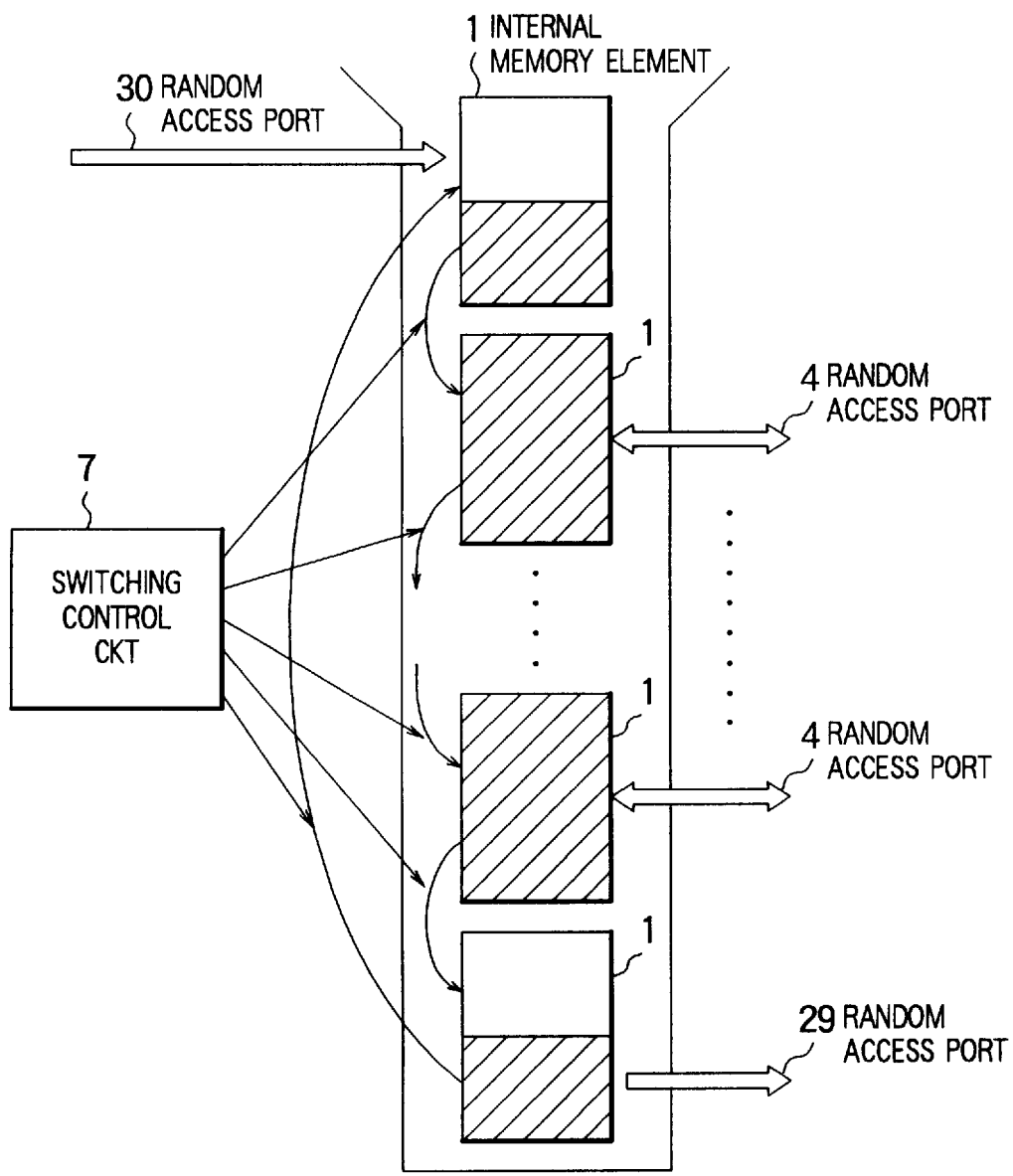
FIG. 11 is a block diagram of an input/output buffer memory circuit according to a fourth embodiment of this invention.

As illustrated in FIG. 11, the input control circuit 3 and the input port 2 in the first embodiment are replaced by the input random access port 30. Furthermore, the output control circuit 6 and the output port 5 in the first embodiment are replaced by the output random access port 29. This embodiment is effective in case where the input/output buffer memory circuit is used in a system such that the random access is preferred as the mode of input/output of the data rather than the sequential access.

A first effect of this invention is that the frequency of the data transfer in the processing system can be minimized. Therefore, the circuit scale of the processing system can be reduced. This is because the control circuit involved in the data transfer can be considerably reduced in the processing system. In addition, power consumption can be reduced. This is because reduction in frequency of the data transfer reduces the number of times of switching of the elements in the system. Particularly in the LSI having a CMOS structure, power consumption can be effectively reduced.

A second effect of this invention is that the buffer memory scale for absorbing the difference in processing phase between the stages in the processing pipeline of the processing system can be reduced. Therefore, the overall scale of the system can be reduced. This is because the individual buffer memories need not be fixedly arranged between the stages but the common buffer memory space is shared in the overall system. Therefore, the efficiency of use of the memory resource is improved as a whole. In addition, the processing delay in the overall system can be reduced. This is because the buffer memories between the processing stages in the system are removed so that any unnecessarily fixed internal delay is no longer present. In response to the arising need, a minimum amount of buffer memory resource is assigned.

A third effect of this invention is that, when the input/output buffer memory circuit is used in a microprocessor circuit, various operations including the input, the reference, the modification, and the output of the data can be simultaneously executed in a pipeline fashion. Therefore, parallel operability in different portions in the system is improved to enhance the performance of the system in data processing.

What is claimed is:

1. An input/output buffer memory circuit for buffering a succession of input data sets to produce a succession of output data sets and comprising:

an input port for receiving each of said input data sets;

a plurality of internal memory elements, each of said memory elements including a plurality of locations sufficient for storing each of said input data sets;

an input control circuit connected to said input port for writing each of said input data sets into a selected one of said internal memory elements as an internal data set;

at least one random access port for individually accessing said internal data sets stored in said memory elements and providing each said accessed data set to internal data processing as a processed data set;

an output port;

an output control circuit connected to said output port for reading the processed data set out of any one of said internal memory elements as a read data set to deliver said read data set to said output port as each of said output data sets; and a switching control circuit for controlling said internal memory elements to successively connect each of said internal memory elements to said input control circuit, said random access port, and said output control circuit.

2. An input/output buffer memory circuit as claimed in claim 1, wherein each of said internal memory elements operates as an input FIFO (First-In First-Out) memory when each of said internal memory elements is connected to said input control circuit under control of said switching control circuit, each of said internal memory elements operating as a random access memory when each of said internal memory elements is connected to said random access port under control of said switching control circuit, each of said internal memory elements operating as an output FIFO (First-In First-Out) memory when each of said internal memory elements is connected to said output control circuit under control of said switching control circuit.

3. An input/output buffer memory circuit as claimed in claim 1, wherein said switching control circuit periodically switches, at a predetermined time interval, said internal memory elements connected to said input control circuit, said random access port, and said output control circuit, respectively, so as to simultaneously carry out an output operation of said output data set from one of said internal memory elements to said output port by said output control circuit, a random access operation to another one of said internal memory elements by said random access port, and an input operation of said input data set from said input port to still another one of said internal memory elements by said input control circuit at a time in said predetermined time interval.

4. An input/output buffer memory circuit as claimed in claim 1, wherein said switching control circuit switches, at a status-dependent time interval, said internal memory elements connected to said input control circuit, said random access port, and said output control circuit, respectively, so as to simultaneously carry out an output operation of said output data set from one of said internal memory elements to said output port by said output control circuit, a random access operation to another one of said internal memory elements by said random access port, and an input operation of said input data set from said input port to still another one of said internal memory elements by said input control circuit at a time in said status-dependent time interval, said status-dependent time interval being determined in dependence upon a status of current connection of each of said internal memory elements to said input control circuit, said random access port, and said output control circuit and upon another status of availability of said input control circuit, said random access port, and said output control circuit to which each of said internal memory elements is subsequently connected.

5. An input/output buffer memory circuit as claimed in claim 1, wherein:
   said at least one random access port is a plurality of random access ports;
   said switching control circuit successively connecting each of said internal memory elements to said plurality of random access ports so that said plurality of random access ports carry out a plurality of random access to each of said internal memory elements to subject the internal data set of each of said internal memory elements to a plurality of internal data processing as said processed data set in a pipeline fashion.

6. An input/output buffer memory circuit as claimed in claim 1, wherein an output random access port is substituted for a combination of said output control circuit and said output port to read the processed data set out of any one of said internal memory elements as said read data set and to deliver said read data set as each of said output data sets.

7. An input/output buffer memory circuit as claimed in claim 1, wherein an input random access port is substituted for a combination of said input port and said input control circuit to receive each of said input data sets and to write each of said input data sets in any one of said internal memory elements as said internal data set.

8. An input/output buffer memory circuit as claimed in claim 1, wherein:
   an input random access port is substituted for a combination of said input port and said input control circuit to receive each of said input data sets and to write each of said input data sets in any one of said internal memory elements as said internal data set;
   an output random access port being substituted for another combination of said output control circuit and said output port to read the processed data set out of any one of said internal memory elements as said read data set and to deliver said read data set as each of said output data sets.

* * * * *